(12) United States Patent
Paulson (10) Patent No.: US 10,590,033 B2
(45) Date of Patent: Mar. 17, 2020

(54) SCRATCH RESISTANT FILMS AND METHODS OF MAKING THE SAME

(71) Applicant: CORNING INCORPORATED, Corning, NY (US)

(72) Inventor: Charles Andrew Paulson, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/907,743

(22) Filed: Feb. 28, 2018

(65) Prior Publication Data

US 2018/0244565 A1    Aug. 30, 2018

Related U.S. Application Data

(60) Provisional application No. 62/476,153, filed on Mar. 24, 2017, provisional application No. 62/464,578, filed on Feb. 28, 2017.

(51) Int. Cl.
| | |
|---|---|
| C03C 17/22 | (2006.01) |
| G06F 1/16 | (2006.01) |
| H05K 5/03 | (2006.01) |
| C03C 17/06 | (2006.01) |
| C03C 17/23 | (2006.01) |
| H05K 5/00 | (2006.01) |

(52) U.S. Cl.
CPC ............ C03C 17/225 (2013.01); C03C 17/06 (2013.01); C03C 17/23 (2013.01); G06F 1/1656 (2013.01); H05K 5/03 (2013.01); C03C 2217/281 (2013.01); C03C 2217/78 (2013.01); C03C 2218/156 (2013.01); G06F 1/1626 (2013.01); H05K 5/0017 (2013.01)

(58) Field of Classification Search
CPC ....... C03C 17/225; C03C 17/06; C03C 17/23; C03C 2217/281; C03C 2217/78; G06F 1/1656; G06F 1/1626; H05K 5/03; H05K 5/0017
USPC .................................................. 260/998.11
See application file for complete search history.

(56) References Cited

U.S. PATENT DOCUMENTS 9,790,593 B2 * 10/2017 Adib ........................ C03C 17/34
2016/0083835 A1   3/2016 Adib et al.

FOREIGN PATENT DOCUMENTS

WO       2015076914 A1    5/2015
WO    WO-2015076914 A1 *  5/2015 .......... C03C 17/3435

OTHER PUBLICATIONS

Fischer-Cripps; "Critical Review of Analysis and Interpretation of Nanoindentation Test Data"; Surface & Coatings Technology, 200 (2006) p. 4153-4165.
Hay et al; "Continuous Stiffness Measurement During Instrumented Indentation Testing"; Experimental Techniques; May/Jun. 2010; p. 86-94.
International Search Report and Written Opinion PCT/US2018/019883 dated May 25, 2018.

* cited by examiner

*Primary Examiner* — Michael Bernshteyn (57) ABSTRACT

An article is provided which includes a substrate and a film disposed on a surface of the substrate. The film includes an aluminum concentration of about 45 atomic % to about 50 atomic %, a nitrogen concentration of about 26 atomic % to about 46 atomic % and an oxygen concentration of from about 4 atomic % to about 24 atomic %. The substrate comprises a bow of less than about 0.0005 meters.

24 Claims, 5 Drawing Sheets

SCRATCH RESISTANT FILMS AND METHODS OF MAKING THE SAME

CROSS-REFERENCE TO RELATED APPLICATIONS

This application claims the benefit of priority under 35 U.S.C. § 119 of U.S. Provisional Application Ser. No. 62/476,153 filed on Mar. 24, 2017 and U.S. Provisional Application Ser. No. 62/464,578 filed on Feb. 28, 2017, the contents of each of which are relied upon and incorporated herein by reference in their entireties.

FIELD OF THE DISCLOSURE

The present disclosure generally relates to scratch resistant films, and more particularly relates to scratch resistant films for glass-based material substrates.

BACKGROUND

Various coatings and films are applied to substrates to enhance optical and protective qualities. Coatings applied to substrates often have a residual stress as a result of processing conditions and/or material properties. Such residual stress may exert a force on the substrate. As the proportion of film to substrate is increased (e.g., due to increasing film thickness and/or decreasing substrate thickness), the residual stress of the film may begin to affect the shape of the substrate by creating a bow in the substrate.

SUMMARY OF THE DISCLOSURE

According to at least one feature of the present disclosure, an article is provided which includes a substrate including a glass-based material. A film is disposed on a surface of the substrate. The film includes an aluminum concentration of about 45 atomic % to about 50 atomic %, a nitrogen concentration of about 26 atomic % to about 46 atomic % and an oxygen concentration of from about 4 atomic % to about 24 atomic %. The substrate comprises a bow of less than about 0.0005 meters.

According to another feature of the present disclosure, an article is provided which includes a substrate including a glass-based material. A film stack is disposed on the substrate. The film stack includes a first layer including aluminum, nitrogen, and oxygen. The oxygen has a concentration within the first layer of from about 4 atomic % to about 24 atomic %. A second layer is positioned adjacent the first layer and includes a refractive index of 1.6 or less.

According to another feature of the present disclosure, an article is provided which includes a substrate having a glass-based material. A film is disposed on the substrate. The film includes aluminum, nitrogen, and oxygen. The oxygen includes a concentration within the film of from about 4 atomic % to about 24 atomic %. A residual stress in the film is from about −200 MPa to about 0 MPa.

According to yet another feature of the present disclosure, a method is provided including the steps: depositing a film on a substrate, the substrate including a glass-based material; forming compressive-stress generating component material within the film; and forming tensile-stress generating component material within the film, wherein the film includes a residual stress of from about −200 MPa to about 200 MPa after the forming steps.

These and other features, advantages, and objects of the present disclosure will be further understood and appreciated by those skilled in the art by reference to the following specification, claims, and appended drawings.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

DETAILED DESCRIPTION

Additional features and advantages of the embodiments will be set forth in the detailed description which follows and will be apparent to those skilled in the art from the description, or recognized by practicing the embodiments as described in the following description, together with the claims and appended drawings.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions.

Figure 1:
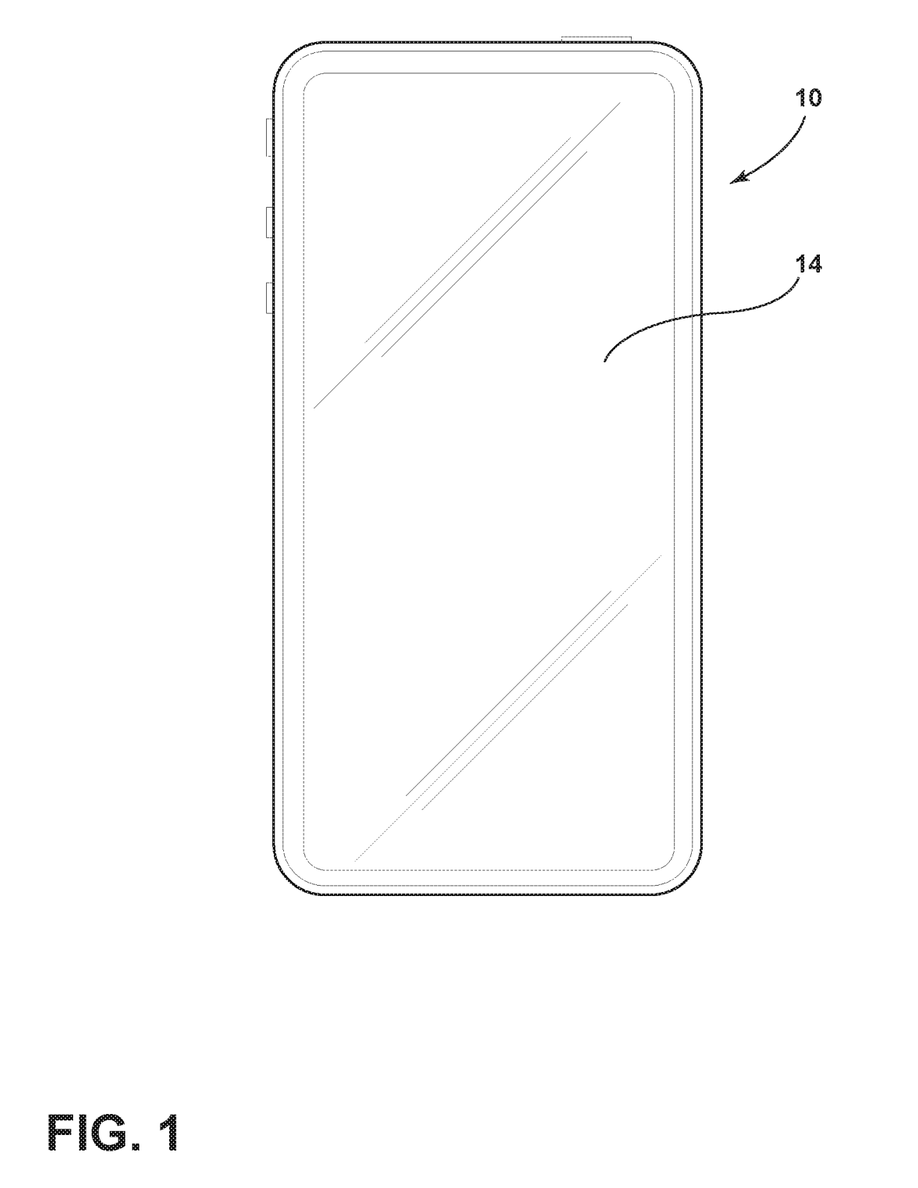
FIG. 1 is a front elevation view of an electronic device, according to one example.

Referring now to FIG. 1, depicted is an electronic device 10 including a cover glass 14. Although a cover glass is described, such is for purposes of illustration only. In actuality, the glass-based substrate disclosed herein may be used as any portion of the housing of the electronic device 10, or any suitable portion within the housing of the electronic device 10. According to various examples, the cover glass 14 may be scratch resistant. The glass-based substrates disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that may benefit from some transparency, scratch-resistance, abrasion resistance or a combination thereof. An exemplary article incorporating any of the strengthened articles disclosed herein is shown in FIG. 1. Specifically, FIG. 1 shows a consumer electronic device 10 including a housing having front, and side surfaces. Electrical components (not shown)

may be at least partially inside or entirely within the housing, the components including at least a controller, a memory, and a display at or adjacent to the front surface of the housing; and a cover glass 14 at or over the front surface of the housing such that it is over the display. In some embodiments, at least one of the cover glass 14 or a portion of the housing may include any of the glass-based substrates disclosed herein. As used herein, the substrates may include silicon wafers, metal, or plastic substrates.

Figure 2A:
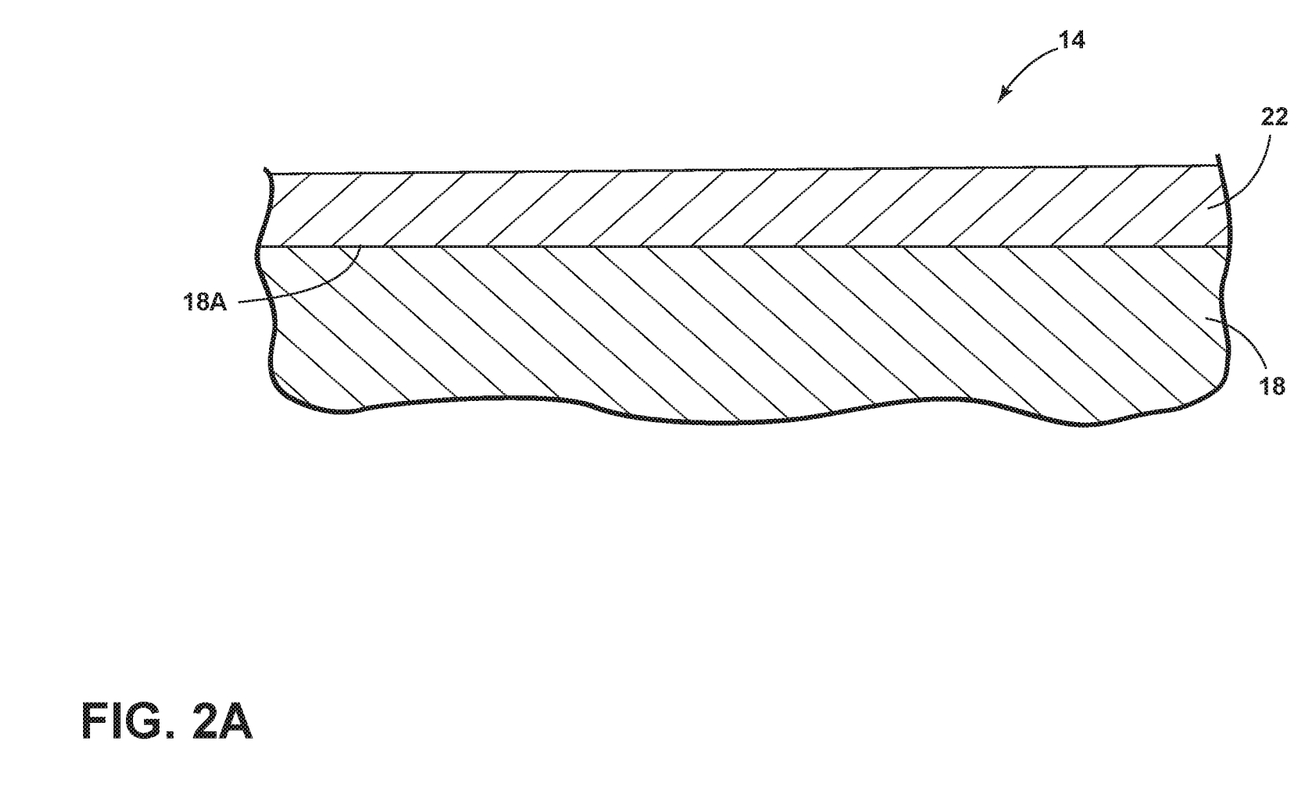
FIG. 2A is a cross-sectional view of a glass-based substrate of the electronic device of FIG. 1, according to one example.
Figure 2B:
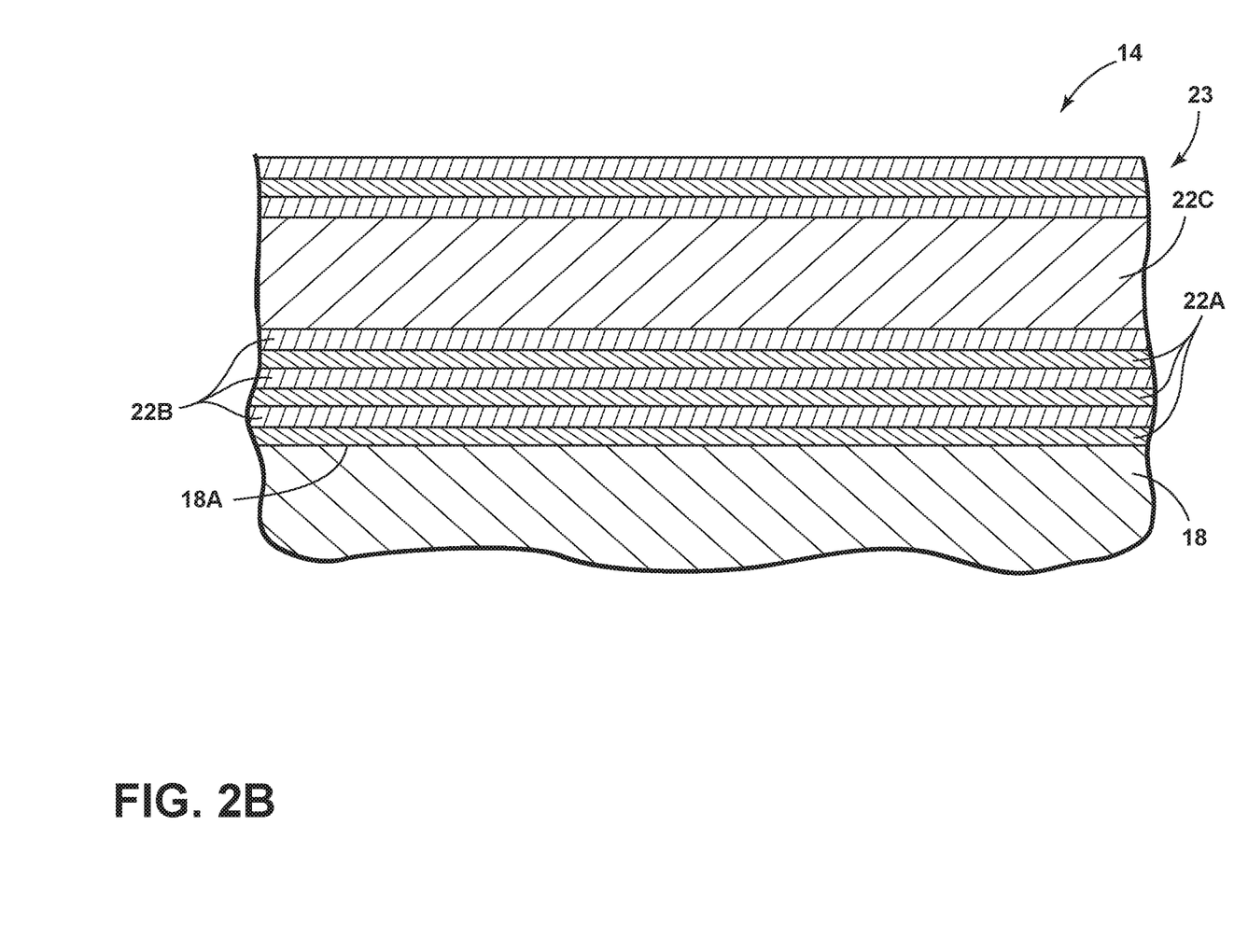
FIG. 2B is a cross-sectional view of the glass—based substrate of the electronic device of FIG. 1, according to another example.

Referring now to FIGS. 2A and 2B, the cover glass 14 may include a substrate 18 defining a major surface 18A. A film 22 is positioned on the surface 18A of the substrate 18. The substrate 18 may be composed of a glass-based material. When made of glass-based materials, the substrate 18 may be ion-exchangeable or non-ion exchangeable. Exemplary ion-exchangeable glasses that may be used as the material of the substrate 18 are alkali aluminosilicate glasses or alkali aluminoborosilicate glasses, though other glass compositions are may be used. As used herein, "ion-exchangeable" means that a glass that is capable of exchanging cations located at or near the surface (e.g., the surface 18A) of the glass (e.g., the substrate 18) with cations of the same valence that are either larger or smaller in size. One example, the composition of the substrate 18 may include $SiO_2$, $B_2O_3$ and $Na_2O$, where $(SiO_2+B_2O_3)>66$ mol. %, and $Na_2O>9$ mol. %. In such an example, the substrate 18 may include about 6 wt. % or more aluminum oxide. The substrate 18 may include one or more alkaline earth oxides, such that a content of alkaline earth oxides is about 5 or more wt. %. Further, the substrate 18 may include one or more of $K_2O$, MgO, and CaO. As used herein the term "glass" is meant to include any material made at least partially of glass, including glass and glass-ceramics. "Glass-ceramics" include materials produced through controlled crystallization of glass. In embodiments, glass-ceramics have about 30% to about 90% crystallinity. Examples of suitable glass-ceramics may include $Li_2O$—$Al_2O_3$—$SiO_2$ system (i.e. LAS-System) glass-ceramics, MgO—$Al_2O_3$—$SiO_2$ system (i.e. MAS-System) glass-ceramics, $ZnO \times Al_2O_3 \times nSiO_2$ (i.e. ZAS system), and/or glass-ceramics that include a predominant crystal phase including β-quartz solid solution, β-spodumene, cordierite, and lithium disilicate. The glass-ceramic substrates may be strengthened using the chemical strengthening processes disclosed herein. In one or more embodiments, MAS-System glass-ceramic substrates may be strengthened in $Li_2SO_4$ molten salt, whereby an exchange of $2Li^+$ for $Mg^{2+}$ can occur.

In a particular example, a composition of the substrate 18 may include 61-75 mol. % $SiO_2$; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO. In another example, the material of the substrate 18 may include 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. %≤$(Li_2O+Na_2O+K_2O)$≤20 mol. %, and 0 mol. %≤(MgO+CaO)≤10 mol. %. In yet another example, the substrate 18 may have a composition of 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. %≤$(Li_2O+Na_2O+K_2O)$≤18 mol. %, and 2 mol. %≤(MgO+CaO)≤7 mol. %.

The thickness of the substrate 18 (e.g., as measured from the surface 18A to a second, opposing, surface 18B) may be from about 0.1 mm to about 19 mm, or from about 0.2 mm to about 5 mm, or from about 0.5 mm to about 2 mm. The substrate may have a length, or largest dimension, of from about 50 mm to about 1,700 mm, or from about 100 mm to about 1,500 mm, or from about 130 mm to about 700 mm. The width of the substrate 18 may be from about 25 mm to about 1,000 mm, or from about 50 mm to about 400 mm, or from about 75 mm to about 200 mm. The substrate 18 may take a variety of shapes, including shapes which are substantially circular, oval, oblong, square, rectangular, and/or higher order polygons.

The substrate 18 may exhibit a bow, deflection, or deformation in a direction perpendicular to the surface 18A of less than about 0.005 m, 0.004 m, 0.003 m, 0.002 m, 0.001 m, 0.0005 m, 0.0004 m, 0.0003 m, 0.0002 m, or less than about 0.0001 m. The bow of the substrate 18 that is caused by film stress may be calculated using equation (1):

$$\text{bow} = \frac{3 * \sigma * d_{substrate}^2 * h_f * (1-v)}{E_{mod} * h_{substrate}^2} \quad (1)$$

where σ (e.g., in MPa) is the stress (e.g., biaxial or "in plane" stress) of the film 22, $h_f$ (e.g., in m) is a thickness of the film 22, v is the Poisson's ratio of the substrate 18, $d^2_{substrate}$ (e.g., in m) is the length or lateral size (e.g., the longest dimension) of the substrate 18, $E_{mod}$ (e.g., in MPa) is the elastic modulus of the substrate 18, and $h^2_{substrate}$ (e.g., in m) is the thickness of the substrate 18. The bow is proportional to the stress σ of the film 22, times a thickness of the film 22 ($h_f$), times the length or lateral size of the substrate 18 squared ($d^2_{substrate}$), divided by the square of the thickness of the substrate 18 $h^2_{substrate}$. In an exemplary calculation using equation (1), for a substrate 100 mm in diameter and 0.4 mm thick, the stress will be ~25 MPa or less for bow<0.1 mm. The bow of the substrate 18 may result due to residual stresses on the film 22 on the surface 18A. For example, the bow of the substrate 18 may result in the substrate 18 having a convex or a concave appearance relative to the surface 18A. It will be understood that by measuring the bow of the substrate 18, the stress (σ) of the film 22 may be determined if the other variables from equation (1) are known. The elastic modulus and Poisson's ratio values recited in this disclosure refer to values as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts." Thickness of the thin film elements (e.g., film 22, 22A, 22B, 22C, 23, etc.) was measured by scanning electron microscope (SEM) of a cross-section, or by optical ellipsometry (e.g., by an n & k analyzer), or by thin film reflectometry. For multiple layer elements (e.g., crack mitigation layer, film, layers in the film stack), thickness measurements by SEM are preferred.

Referring now to FIG. 2A, the film 22 is depicted as positioned on the surface 18A of the substrate 18, but it will be understood that the film 22 may be applied to any surface (e.g., sides or bottom surfaces of the substrate 18). The film 22 may be applied to the surface 18A via sputtering, drum coating, molecular beam epitaxy, electron beam evaporator, pulsed laser deposition, cathodic arc deposition, electrohydrodynamic deposition, other application techniques, or combinations thereof. The film 22 may be applied at a deposition rate of greater than or equal to about 0.01 nm/s, 0.1 nm/s, 0.2 nm/s, 0.3 nm/s, 0.4 nm/s, 0.5 nm/s, 0.6 nm/s, 0.7 nm/s, 0.8 nm/s, 0.9 nm/s, or greater than or equal to about 1.0 nm/s. The film 22 may have a thickness of from about 10 nm to about 5 μm, from about 100 nm to about 4 μm, from about 150 nm to about 3 μm, or from about 200 nm to about 2 μm. The film 22 may vary in thickness across the surface 18A of the substrate 18. In the depicted example, the film 22 is a single layer, but in other examples, as provided below, the film 22 may be formed of a plurality of layers. The film 22 may include the elements aluminum (Al), nitrogen (N), and oxygen (O). It will be understood that the film 22 may also include small (e.g., about 1.0 atomic % or less) amounts of boron (B) and/or silicon (Si) without departing from the teachings provided herein. The film 22 may include the compounds AlN, AlON, $Al_2O_3$ and AlON and combinations thereof. The elements Al, N and O and the compounds AlN, AlON and $Al_2O_3$ may be deposited at substantially the same time, in alternating layers, or combinations thereof. Further, some elements and compounds may be deposited in combination with one or more other elements or compounds.

The film 22 may have an atomic aluminum composition of greater than or equal to about 10%, 20%, 30%, 40%, 41%, 42%, 43%, 44%, 45%, 46%, 47%, 48%, 49%, 50%, 55%, 60%, 70%, 80%, or greater than or equal to about 90%. In specific examples, the atomic aluminum composition of the film 22 may be about 40% or more, about 41% or more, about 42% or more, about 43% or more, about 44% or more, about 45% or more, about 46% or more, about 47% or more, about 48% or more, about 49% or more, or about 50% or more. The film 22 may have an atomic nitrogen composition of greater than or equal to about 10%, 15%, 20%, 25%, 30%, 35%, 36%, 40%, 45%, 50%, or greater than or equal to about 55%. In a specific example, the film 22 may have an atomic nitrogen composition of about 36% or more. The film 22 may also have an atomic oxygen composition from about 4% to about 24%, from about 6.5% to about 21.5%, from about 9% to about 19%, or from about 11.5% to about 16.5%. In specific examples, the film 22 may have an atomic oxygen concentration of about 12%, about 13%, about 14%, about 15%, about 16%, or about 17%.

The film 22 may exhibit a hardness greater than or equal to about 1 GPa, 2 GPa, 5 GPa, 7 GPa, 10 GPa, 12 GPa, 15 GPa, 19 GPa, or greater than or equal to about 25 GPa. In many cases, coatings and films exhibiting a high hardness (e.g., greater than about 5 GPa or 10 GPa) typically exhibit a high residual stress (e.g., greater than about 25 MPa or 1 GPa). In examples of the film 22 which exhibit a high hardness (e.g., greater than about 1 GPa), the film 22 may provide scratch resistance to the substrate 18 of the cover glass 14. Hardness of thin film coatings are determined using widely accepted nanoindentation practices. See: Fischer-Cripps, A. C., Critical Review of Analysis and Interpretation of Nanoindentation Test Data, Surface & Coatings Technology, 200, 4153-4165 (2006) (hereinafter "Fischer-Cripps"); and Hay, J., Agee, P, and Herbert, E., Continuous Stiffness measurement During Instrumented Indentation Testing, Experimental Techniques, 34 (3) 86-94 (2010) (hereinafter "Hay"). For coatings, it is typical to measure hardness and modulus as a function of indentation depth. So long as the coating is of sufficient thickness, it is then possible to isolate the properties of the coating from the resulting response profiles. It should be recognized that if the coatings are too thin (for example, less than ~500 nm), it may not be possible to completely isolate the coating properties as they can be influenced from the proximity of the substrate which may have different mechanical properties. See Hay. The methods used to report the properties herein are representative of the coatings themselves. The process is to measure hardness and modulus versus indentation depth out to depths approaching 1000 nm. In the case of hard coatings on a softer glass, the response curves will reveal maximum levels of hardness and modulus at relatively small indentation depths (less than or equal to about 200 nm). At deeper indentation depths both hardness and modulus will gradually diminish as the response is influenced by the softer glass substrate. In this case, the coating hardness and modulus are taken be those associated with the regions exhibiting the maximum hardness and modulus. In the case of soft coatings on a harder glass substrate, the coating properties will be indicated by lowest hardness and modulus levels that occur at relatively small indentation depths. At deeper indentation depths, the hardness and modulus will gradually increase due to the influence of the harder glass. These profiles of hardness and modulus versus depth can be obtained using either the traditional Oliver and Pharr approach (as described in Fischer-Cripps) or by the more efficient continuous stiffness approach (see Hay). Extraction of reliable nanoindentation data requires that well-established protocols be followed. Otherwise, these metrics can be subject to significant errors. The elastic modulus and hardness values reported herein for such thin films were measured using known diamond nanoindentation methods, as described above, with a Berkovich diamond indenter tip.

The film 22 may be substantially transparent (e.g., greater than or equal to about 80%, 90%, or 99% transparent) to visible and non-visible wavelengths of light. According to various examples, the film 22 has an index of refraction of from about 1.92 to about 2.05 at 550 nm. According to various examples, the film 22 may have an absorption coefficient of about 0.001 at 400 nm.

The film 22 may include one or more tensile components and compressive components. The tensile and compressive components may include individual molecular compounds, localized regions, layers and/or combinations thereof. It will be understood that in examples where the tensile and compressive components are individual molecular compounds and/or localized regions, the components may be homogenously or inhomogeneously dispersed across and within the film 22. Certain materials (e.g., AlN) may generally give rise to tensile stress components (or tensile components) in the film 22 after formation of the film 22. For example, after the film 22 has been applied to the substrate 18 and cooled, the tensile components may tend to generate a tensile, or "pulling," stress within the film 22. Tensile stresses are designated with a positive magnitude in the disclosure. Certain other materials (e.g., AlON, $Al_2O_3$) may generally give rise to compressive stress components (compressive components) in the film 22 after formation. For example, after the film 22 has been applied to the substrate 18 and cooled, the compressive components may tend to generate a compressive, or "pushing," stress within the film 22. Compressive stresses are designated with a negative magnitude in the disclosure. It will be understood that the magnitude of tensile and/or compressive stresses generated may be the same as, or different than, one another. In other words, the magnitude of compressive stress generated per unit of compressive-stress-generating component materials may be the same, greater than or less than the tensile forces created per unit of tensile-stress-generating component materials. As explained above, residual stresses in the film 22 may result in the bow of the substrate 18. As such, tailoring the proportions of tensile and compressive-stress-generating component materials in the film 22 may allow the tuning of the overall residual stress in the film 22 and therefore the bow of the substrate 18.

By adjusting the various proportions and/or locations of the tensile and compressive-stress-generating component materials present within the film 22, the total and/or the local residual stress of the film 22 may be tailored to a desired level. For example, if a total residual stress in the film 22 which is compressive is desired, the proportion of compressive-stress-generating component materials to tensile-stress-generating component materials may be adjusted (e.g., such that a greater proportion of the film 22 is composed of compressive-stress-generating component materials) such that the residual stress of the film 22 is compressive. Conversely, if a total tensile residual stress in the film 22 is desired, the proportion of tensile-stress-generating component materials to compressive-stress-generating component materials may be adjusted (e.g., to a greater proportion of the film 22 is tensile-stress-generating component materials) such that the residual stress of the film 22 is tensile. Further, the proportions of the compressive and tensile-stress-generating component materials may be adjusted such that a neutral stress (e.g., ±1 GPa) is achieved for the film 22. For example, neutral residual stress examples of the film 22 may have a residual stress of less than or equal to about ±1 GPa, ±750 MPa, ±500 MPa, ±250 MPa, ±200 MPa, ±100 MPa, ±75 MPa, ±50 MPa, ±25 MPa, ±10 MPa, ±5 MPa, or less than or equal to about ±1 MPa. The residual stress σ of the film 22 may be calculated using equation (2):

$$\sigma = \left(\frac{E}{1-\nu}\right) * \left(\frac{1}{6}\right) * \frac{h_s^2}{h_f} * \frac{1}{ROC} \quad (2)$$

where E is the modulus of the substrate 18, ν is the Poisson's ratio for the substrate 18, $h_s$ is the thickness of the substrate 18, $h_f$ is the thickness of the film 22, and ROC is the radius of curvature for the cover glass 14. According to various examples, if a residual stress is present within the film 22, the stress may be a net compressive stress. Examples of the film 22 having a net compressive stress may be advantageous in reducing the propagation of cracks within the cover glass 14 as the net compressive stress may tend to force together a crack propagation zone of the substrate 18. Reducing the residual stress of the film 22 (e.g., toward 0 MPa) may be advantageous in reducing the bow, or deformation, experienced by the substrate 18 as the residual stress is a primary driver of distortion in the substrate 18. Further, use of the film 22 may be advantageous in providing a low or near neutral residual stress while providing a high hardness. As explained above, conventional coatings and treatments do not exhibit high hardness without a corresponding increase in residual stress. As such, by tailoring the proportions of compressive-stress-generating component materials and tensile-stress-generating component materials within the film 22, both a high hardness and a low residual stress may advantageously be achieved by the film 22.

The tensile and compressive-stress-generating component materials may be dynamically formed as the atomic and molecular components of the film 22 are applied to the surface 18A. For example, as the relative proportions of Al, N, Si and O deposited onto the surface 18A are adjusted, the proportion of tensile and compressive stress components are adjusted as the relative precursor elements change. According to various examples, the proportions of the tensile and compressive stress components in the film may be adjusted based on the amount of oxygen included within the film 22. For example, as the materials (e.g., AlON, $Al_2O_3$) that generate compressive stress components typically include oxygen, and the materials (e.g., AlN) that generate tensile stress components do not, increasing the proportion of oxygen within the film 22 may increase the proportion of compressive stress components relative to the tensile stress components. As explained above, the film 22 may have an atomic oxygen composition of from about 4% to about 24%, or from 6.5% to about 21.5%, or from 9% to about 19%, or from 11.5% to about 16.5%. In specific examples, the film 22 may have an atomic oxygen concentration of about 12%, about 13%, about 14%, about 15%, about 16%, or about 17%. The oxygen may be included as the film 22 is applied in a continuous manner, in an intermittent manner, or combinations thereof. As such, as the film 22 is deposited, the presence of oxygen will tend to form the compressive stress components, while a lack of oxygen will tend to form the tensile stress components. Accordingly, by adjusting the amount of oxygen provided during the deposition of the film 22, and therefore present in the film 22, the residual stress in the film 22 may be controlled.

Referring now to FIG. 2B, depicted is an example of the film (similar to film 22 of FIG. 2A) incorporating a plurality of layers. In such an example, the film may be called a film stack 23. In some aspects, the film stack 23 may include a plurality of first layers 22A, a plurality of second layers 22B and a third layer 22C. It will be understood that although depicted with a plurality of first and second layers 22A, 22B, the film stack 23 may include a single first layer 22A and a single second layer 22B without departing from the teachings provided herein. The first and second layers 22A, 22B may be positioned on one another and arranged in an alternating manner such that the first and second layers 22A, 22B are adjacent one another. The film stack 23 may include from 1 to 100 first layers 22A. The film stack 23 may include from 1 to 100 second layers 22B. In the depicted example, the first layer 22A is positioned adjacent, and in contact, with the substrate 18, but it will be understood that the second layer 22B may be in contact with the surface 18A of the substrate 18 without departing from the teachings provided herein. The plurality of first and second layers 22A, 22B may have a thickness of from about 1 nm to about 800 nm. According to various examples, a total thickness of the plurality of first layers 22A is greater than a total thickness of the plurality of second layers 22B. In other words, the sum thickness of the plurality of first layers 22A may be greater than the sum thickness of the second layers 22B. According to various examples, the first layers 22A may have a high refractive index relative to that of the second layers 22B. In other words, the second layers 22B may have a low refractive index relative to that of the first layers 22A. The refractive index of the first layers 22A may be from about 1.92 to about 2.05 at 550 nm. The refractive index of the second layers 22B may be less than about 1.6 at 550 nm. In other words, the second layers 22B may be composed of a low refractive index material.

The first layers 22A may have a composition substantially similar to that of the film 22 in the single layer example (FIG. 2A). For example, the first layers 22A may include both the materials (e.g., AlON, $Al_2O_3$ and AlON) generating compressive stress components, and the materials (e.g., AlN) generating tensile stress components, as explained above. Each of the first plurality of layers 22A may have a thickness of from about 4 nm to about 100 nm. Further, the thicknesses of each of the first layers 22A may vary across the film stack 23.

The second layers 22B may have a composition which provides a low refractive index. For example, the second layers 22B may include $SiO_2$, $Al_2O_3$, $GeO_2$, SiO, $AlO_xN_y$, $SiO_xN_y$, $Si_uAl_vO_xN_y$, MgO, $MgF_2$, $BaF_2$, $CaF_2$, $DyF_3$, $YbF_3$, $YF_3$, $CeF_3$, and combinations thereof. Each of the second layers 22B may have a thickness of from about 4 nm to about 100 nm. Further, the thicknesses of the second layers 22B may vary across the film stack 23.

According to some examples, a third layer 22C is optionally positioned within the film stack 23 of the first and second layers 22A, 22B. The third layer 22C may have a thickness of from about 200 nm to about 2 μm. As such, the third layer 22C may account for from about 40% to about 99% of the total thickness of the film stack 23. The third layer 22C may include the materials generating compressive-stress components, the materials generating tensile stress components, or combinations thereof as described above. The third layer 22C may amount to such a large portion of the film stack 23 that its properties (e.g., hardness, optical clarity, residual stress, etc.) may largely govern the overall properties of the film stack 23. As such, by tuning the residual stress of the third layer 22C, the bow of the substrate 18 may be controlled largely independently of the effects generated by the first and second plurality of layers 22A, 22B.

According to various examples, the film 22 and/or film stack 23 of the electronic device 10 may be formed form an exemplary method. The method may begin with a first step of depositing the film 22 and/or film stack 23 on the substrate 18. In such an example, the substrate 18 may be composed of a glass-based material as explained above. As explained above, the film 22 may be composed of a single layer and the film stack 23 may be formed from a plurality of layers. Next, a step of forming materials generating compressive stress components within the film 22 and/or film stack 23 may performed. The compressive-stress-generating materials may produce a compressive stress within the film 22 and/or film stack 23 as explained above. Next, a step of forming materials that generate tensile stress components within the film 22 and/or film stack 23 is performed. The materials generating tensile stress components may produce a tensile stress within the film 22 and/or film stack 23. According to various examples, the relative proportions of tensile and compressive-stress-generating component materials produces a residual stress in the film 22 and/or film stack 23 of from about −200 MPa to about 200 MPa. The method may further include a step of forming the compressive-stress-generating components to include oxygen. It will be understood that although described as separate discrete steps in a particular order, the steps of the method may be performed in any order and/or simultaneously.

Use of the present disclosure and the film 22 and film stack 23 provided herein may offer a variety of advantages. First, by tailoring the oxygen concentration of the film 22 and film stack 23, and therefore the relative proportions of the tensile-stress-generating components and compressive-stress-generating components, the residual stress of the film 22 and film stack 23 may be controlled. As explained above, by controlling the residual stress of the film 22 and film stack 23, the bow of the substrate 18 may be controlled which may allow for greater control of the final shape and/or dimensions of the cover glass 14. Second, by tailoring the amount of oxygen present in the film 22 and film stack 23, a film 22 and film stack 23 which is hard, transparent and has a low residual stress may be obtained. Further, the film 22 and film stack 23 may provide a scratch resistant coating to the cover glass 14.

EXAMPLES

Figure 3:
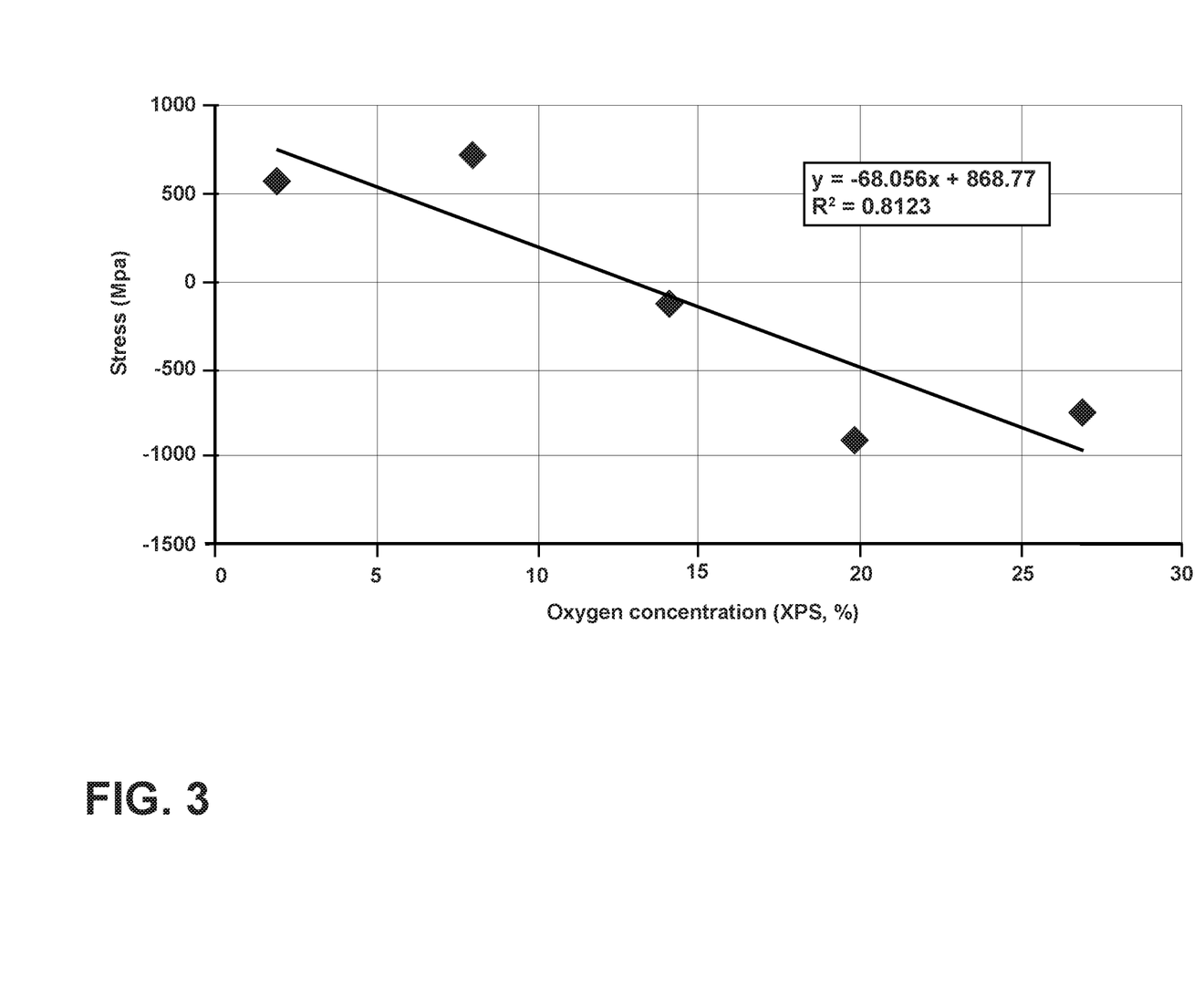
FIG. 3 is a graph of stress vs. oxygen concentration within a film.

Referring now to FIG. 3, depicted is a graph of the residual stress of a coating (e.g., the film 22 or film stack 23) as a function of oxygen concentration within the coating. The coating was formed using an AJA International® magnetron sputtering system. As can be seen, the coating exhibits a residual stress of less than about 1 GPa (1000 MPa) in atomic oxygen concentrations from about 2% to about 27%. The coating has a near neutral stress of about 0 MPa at an atomic oxygen concentration of from about 11%-16% which is centered on about 14% or 15% atomic oxygen concentration. As explained above, it is believed that the transition between a net tensile residual stress, through an about neutral stress, and into a net compressive residual stress, is governed by the proportion of compressive-stress-generating component materials to tensile-stress-generating component materials. As the oxygen concentration within the coating increases, a greater proportion of compressive-stress-generating component materials is present relative to the tensile-stress-generating component materials, and residual stress of the coating transitions from tensile to neutral to compressive. An equation for the provided regression line predicts that the oxygen concentration at which a net zero residual stress occurs is about 12.7 atomic percent. Although the graph of FIG. 3 includes only five data points, the provided regression line is expected to hold approximately true for concentrations within the 2% to 27% range as the provided data matches well with the experimental data provided in FIG. 4 (described below). Further, the regression line trends in a manner which tends to confirm that the relative proportion of tensile-stress-generating component materials to compressive-stress-generating component materials is important in determining the net residual stress of the coating.

Figure 4:
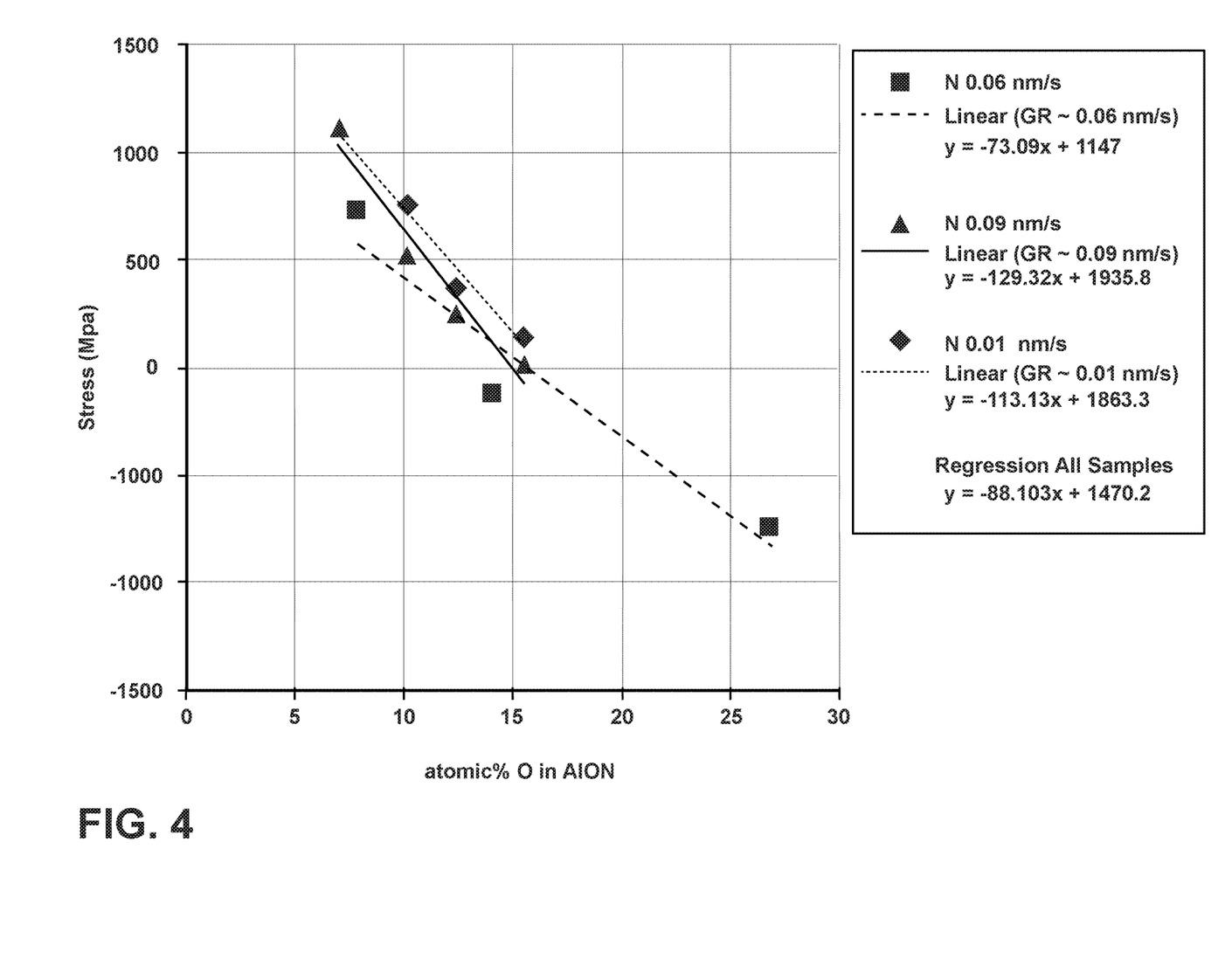
FIG. 4 is a graph of stress vs. oxygen concentration in a film where the film has been deposited with a range of deposition rates.

Referring now to FIG. 4, depicted is a graph of the residual stress of the coatings (e.g., the films 22) vs. atomic oxygen concentration as a function of growth rate (e.g., deposition rate, namely, 0.01 nanometers per second (nm/s), 0.06 nm/s, and 0.09 nm/s) using different deposition tools. As can be seen, regardless of the deposition rate, the coating exhibits a near neutral stress from about 13 to 17 atomic percent oxygen concentration. In the provided regression equation for the growth rates, the regression equation predicts a net neutral stress at an oxygen concentration of about 16.7 atomic percent oxygen. The regression equation for the 0.06 nm/s growth rate predicts a net neutral stress at an oxygen concentration at about 15.7 atomic percent oxygen. The regression equation for the 0.09 nm/s growth rate predicts a net neutral stress at an oxygen concentration of about 15.0 atomic percent oxygen. The regression equation for the 0.01 nm/s growth rate predicts a net neutral stress at an oxygen concentration of about 16.5 atomic percent oxygen.

Modifications of the disclosure will occur to those skilled in the art and to those who make or use the disclosure. For example, the disclosure of the film 22 or stack 23 and the cover glass 14 of the electronic device 10 may be applied to furniture (e.g., glass table tops), transparencies (e.g., building or automotive windows) and other glass features such as television screens and computer monitors. Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

For purposes of this disclosure, the term "coupled" (in all of its forms: couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature, or may be removable or releasable in nature, unless otherwise stated.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

It will be apparent to those skilled in the art that various modifications and variations can be made to the present disclosure without departing from the spirit and scope of the disclosure. Thus, it is intended that the present disclosure cover such modifications and variations provided they come within the scope of the appended claims and their equivalents. Example embodiments include the following.

Embodiment 1

An article comprising:
a substrate; and
a film disposed on a surface of the substrate, the film comprising:
an aluminum composition of about 45 atomic % to about 50 atomic %;
a nitrogen composition of about 26 atomic % to about 46 atomic %; and
an oxygen concentration of from about 4 atomic % to about 24 atomic %,
wherein the substrate comprises a bow of less than about 0.0005 meters.

Embodiment 2

The article of embodiment 1, wherein the oxygen concentration is from about 6.5 atomic % to about 21.5 atomic %.

Embodiment 3

The article of embodiment 1, wherein the oxygen concentration is from about 9 atomic % to about 19 atomic %.

Embodiment 4

The article of embodiment 1, wherein the oxygen concentration is from about 11.5 atomic % to about 16.5 atomic %.

Embodiment 5

The article of embodiment 1, wherein the oxygen concentration is about 14 atomic %.

Embodiment 6

The article of any one of embodiments 1-5, wherein the film comprises a thickness of from about 200 nm to about 3 µm.

Embodiment 7

The article of any one of embodiments 1-5, wherein the film comprises a thickness of from about 10 nm to about 5 µm.

Embodiment 8

The article of any one of embodiments 1-7, wherein the film comprises a hardness about 15 GPa or more and the film comprises an index of refraction of from about 1.92 to about 2.05 at 550 nm.

Embodiment 9

The article of any one of embodiments 1-8, wherein the substrate comprises a bow of less than about 0.0002 meters.

Embodiment 10

The article of any one of embodiments 1-9, wherein the film comprises a residual compressive stress of about 25 MPa or less.

Embodiment 11

The article of any one of embodiments 1-10, wherein the film comprises a single layer of material.

Embodiment 12

An article comprising:
a substrate; and
a film stack disposed on the substrate, the film stack comprising:
a first layer comprising:
aluminum;

nitrogen; and oxygen, the oxygen at a concentration within the first layer of from about 4 atomic % to about 24 atomic %; and a second layer positioned adjacent the first layer and comprising a refractive index of 1.6 or less.

Embodiment 13

The article of embodiment 12, wherein the film stack comprises a plurality of first layers and a plurality of second layers positioned in an alternating manner and at least one of the plurality of second layers comprises silicon dioxide.

Embodiment 14

The article of embodiment 13, wherein a total thickness of the plurality of first layers is greater than a total thickness of the plurality of second layers.

Embodiment 15

The article of embodiment 12, further comprising:
a third layer positioned within the film stack and comprising the same composition as the first layer, wherein the third layer has a greater thickness than the first layer.

Embodiment 16

The article of embodiment 15, wherein the third layer comprises an oxygen concentration of from about 14 atomic % to about 15 atomic %.

Embodiment 17

An article comprising:
a substrate; and
a film disposed on the substrate, the film comprising:
aluminum;
nitrogen; and
oxygen, the oxygen at a concentration within the film of from about 4 atomic % to about 24 atomic %, wherein a residual stress in the film is from about −200 MPa to about 0 MPa.

Embodiment 18

The article of embodiment 17, wherein the oxygen concentration within the film is from about 10 atomic % to about 18 atomic %.

Embodiment 19

The article of embodiment 17 or embodiment 18, wherein the film consists of a single layer.

Embodiment 20

The article of embodiment 17 or embodiment 18, wherein the film comprises a plurality of layers.

Embodiment 21

A consumer electronic product, comprising:
a housing having a front surface, a back surface and side surfaces;

electrical components provided at least partially within the housing, the electrical components including at least a controller, a memory, and a display, the display being provided at or adjacent the front surface of the housing; and
a cover material disposed over the display,
wherein at least one of a portion of the housing or the cover material comprises the article of any one of embodiments 1-20 or 29.

Embodiment 22

A method of forming an article, comprising:
depositing a film on a substrate;
forming compressive-stress generating component material within the film; and
forming tensile-stress generating component material within the film, wherein the film comprises a residual stress of from about −200 MPa to about 200 MPa after the forming steps.

Embodiment 23

The method of embodiment 22, wherein the step of forming the compressive-stress generating component material further comprises forming components comprising oxygen.

Embodiment 24

The method of embodiment 22 or embodiment 23, wherein the step of depositing the film further consists of depositing a single layer.

Embodiment 25

The method of embodiment 22 or embodiment 23, wherein the step of depositing the film further comprises depositing a plurality of layers.

Embodiment 26

The method of any one of embodiments 22-25, wherein the step of depositing the film further comprises depositing aluminum, oxygen and nitrogen.

Embodiment 27

The method of embodiment 26, wherein the step of depositing the film further comprises depositing material components having an oxygen concentration of from about 14 atomic % to about 15 atomic %.

Embodiment 28

The method of any one of embodiments 22-27, wherein the substrate comprises a glass-based material.

Embodiment 29

The article of any one of embodiments 1-20, wherein the substrate comprises a glass-based material.

Embodiment 30

The article of any one of embodiments 1-20, wherein the aluminum composition comprises about 47 atomic % to about 50 atomic %;

What is claimed is:

1. An article comprising:
a substrate; and
a film disposed on a surface of the substrate, the film comprising:
an aluminum composition of about 45 atomic % to about 50 atomic %;
a nitrogen composition of about 26 atomic % to about 46 atomic %; and
an oxygen concentration of from about 11.5 atomic % to about 16.5 atomic %, wherein the substrate comprises a bow of less than about 0.0005 meters, and
further wherein the film comprises a residual stress from about −200 MPa to about +200 MPa.

2. The article of claim 1, wherein the oxygen concentration is about 14 atomic %.

3. The article of claim 1, wherein the film comprises a thickness of from about 200 nm to about 3 μm.

4. The article of claim 1, wherein the film comprises a thickness of from about 10 nm to about 5 μm.

5. The article of claim 1, wherein the film comprises a hardness about 15 GPa or more and the film comprises an index of refraction of from about 1.92 to about 2.05 at 550 nm.

6. The article of claim 1, wherein the substrate comprises a bow of less than about 0.0002 meters.

7. The article of claim 1, wherein the residual stress is from about −25 MPa to about 0 MPa.

8. The article of claim 1, wherein the film comprises a single layer of material.

9. An article comprising:
a substrate; and
a film stack disposed on the substrate, the film stack comprising:
a first layer comprising:
aluminum;
nitrogen; and
oxygen, the oxygen at a concentration within the first layer of from about 11.5 atomic % to about 16.5 atomic %;
a second layer positioned adjacent the first layer and comprising a refractive index of 1.6 or less; and
a third layer positioned within the film stack and comprising the same composition as the first layer, wherein the third layer has a greater thickness than the first layer,
wherein each of the first and second layers comprises a thickness from about 4 nm to about 100 nm and the third layer comprises a thickness from about 200 nm to about 2 μm,
wherein the thickness of the third layer is from about 40% to about 99% of the total thickness of the film stack,
wherein the film stack comprises a residual stress from about −200 MPa to about +200 MPa, and
further wherein the substrate comprises a bow of less than 0.0005 meters.

10. The article of claim 9, wherein the film stack comprises a plurality of first layers and a plurality of second layers positioned in an alternating manner and at least one of the plurality of second layers comprises silicon dioxide.

11. The article of claim 10, wherein a total thickness of the plurality of first layers is greater than a total thickness of the plurality of second layers.

12. The article of claim 9, wherein the third layer comprises an oxygen concentration of from about 14 atomic % to about 15 atomic %.

13. An article comprising:
a substrate; and
a film disposed on the substrate, the film comprising:
aluminum;
nitrogen; and
oxygen, the oxygen at a concentration within the film of from about 12.7 atomic % to about 16.5 atomic %, wherein a residual stress in the film is from about −200 MPa to about 0 MPa, and
further wherein the substrate comprises a bow of less than 0.0005 meters.

14. The article of claim 13, wherein the film consists of a single layer.

15. The article of claim 13, wherein the film comprises a plurality of layers.

16. The article of claim 1, wherein the substrate comprises a glass-based material.

17. A method of forming the article of claim 9, comprising:
depositing the film stack on the substrate;
forming compressive-stress generating component material within the film; and
forming tensile-stress generating component material within the film, wherein the film comprises a residual stress of from about −200 MPa to about 200 MPa after the forming steps.

18. The method of claim 17, wherein the step of forming the compressive-stress generating component material further comprises forming components comprising oxygen.

19. The method of claim 17, wherein the step of depositing the film further consists of depositing a single layer.

20. The method of claim 17, wherein the step of depositing the film further comprises depositing a plurality of layers.

21. The method of claim 17, wherein the step of depositing the film further comprises depositing aluminum, oxygen and nitrogen.

22. The method of claim 21, wherein the step of depositing the film further comprises depositing material components having an oxygen concentration of from about 14 atomic % to about 15 atomic %.

23. The method of claim 17, wherein the substrate comprises a glass-based material.

24. The article of claim 1, wherein the aluminum composition comprises about 47 atomic % to about 50 atomic %.

* * * * *